(12) United States Patent
Kim et al.

(10) Patent No.: US 11,901,338 B2
(45) Date of Patent: Feb. 13, 2024

(54) INTERWAFER CONNECTION STRUCTURE FOR COUPLING WAFERS IN A WAFER STACK

(71) Applicant: XILINX, INC., San Jose, CA (US)

(72) Inventors: Myongseob Kim, Pleasanton, CA (US); Henley Liu, San Jose, CA (US); Cheang Whang Chang, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 81 days.

(21) Appl. No.: 17/515,354

(22) Filed: Oct. 29, 2021

(65) Prior Publication Data

US 2023/0140675 A1 May 4, 2023

(51) Int. Cl.
| | | |
|---|---|---|
| *G01R 31/28* | (2006.01) | |
| *H01L 21/66* | (2006.01) | |
| *H01L 25/065* | (2023.01) | |
| *H01L 23/00* | (2006.01) | |

(52) U.S. Cl.
CPC .......... *H01L 25/0657* (2013.01); *H01L 22/32* (2013.01); *H01L 24/08* (2013.01); *H01L 2224/08145* (2013.01); *H01L 2225/06596* (2013.01)

(58) Field of Classification Search
CPC ..................... H01L 22/32; H01L 22/34; H01L 2224/08145; H01L 2225/06596; H01L 24/80; H01L 25/0657
See application file for complete search history.

(56) References Cited

U.S. PATENT DOCUMENTS

| | | |
|---|---|---|
| 6,781,226 B2 | 8/2004 | Huppenthal et al. |
| 7,126,214 B2 | 10/2006 | Huppenthal et al. |
| 7,282,951 B2 | 10/2007 | Huppenthal et al. |
| 7,294,937 B2 | 11/2007 | Su et al. |
| RE42,035 E | 1/2011 | Huppenthal et al. |
| 10,262,911 B1 | 4/2019 | Gong et al. |
| 11,119,146 B1 * | 9/2021 | Chong .................... H01L 22/14 |
| 2015/0233698 A1 * | 8/2015 | Huang .................. H01L 21/768 324/691 |
| 2017/0350939 A1 * | 12/2017 | Goel .............. G01R 31/318536 |
| 2022/0336299 A1 * | 10/2022 | Lu ........................... H01L 24/80 |
| 2022/0359456 A1 * | 11/2022 | Chen ...................... H01L 24/09 |

\* cited by examiner

*Primary Examiner* — Anthony Ho
*Assistant Examiner* — David J Goodwin
(74) *Attorney, Agent, or Firm* — Patterson + Sheridan, LLP

(57) ABSTRACT

An integrated circuit (IC) device is disclosed which includes at least a first hybrid bond interface layer disposed between adjacent wafers of a wafer stack. Routing within the hybrid bond interface layer allows test pads exposed on a top wafer of the wafer stack to electrically couple test keys within the wafer stack. By utilizing the routing within the hybrid bond interface layer to index electrical connections between adjacent wafers, IC dies stacked on the wafers may be fabricated with less mask sets as compared to conventional designs.

19 Claims, 4 Drawing Sheets

INTERWAFER CONNECTION STRUCTURE FOR COUPLING WAFERS IN A WAFER STACK

TECHNICAL FIELD

Disclosed herein is a wafer stack having an interwafer connection structure disposed between adjacent wafers of the wafer stack.

BACKGROUND

Electronic devices often employ electronic components, which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices. These electronic devices containing one or more chip packages are frequently utilized in advanced electronic computing systems, such as found in telecomm and datacomm equipment, data centers and automotive electronics, among others.

In many chip package assemblies, the IC dies are stacked to provide increased memory or processing capabilities within a single chip package assembly. Although stacking IC dies is desirable for the increased memory or processing capabilities, stacking IC dies during the manufacture of stacked integrated circuit devices presents additional fabrication complexity, challenges and consequently cost. In particular, IC dies that are stacked in an IC die package often require different mask sets for manufacturing in order to enable routing of test signals provided to the exposed pads of the outermost die. Since the cost and time required to design, tape out and qualify each mask set is high, the need for different mask sets for IC dies utilized in a die stack can undesirably drive the cost of design very high while making the time to design very long.

Therefore, a need exists for an improved integrated circuit device having an IC die stack.

SUMMARY

An integrated circuit (IC) device is disclosed which includes at least a first hybrid bond interface layer disposed between adjacent wafers of a wafer stack. Routing within the hybrid bond interface layer allows test pads exposed on a top wafer of the wafer stack to electrically couple test keys within the wafer stack. By utilizing the routing within the hybrid bond interface layer to index electrical connections between adjacent wafers, IC dies stacked on the wafers may be fabricated with less mask sets as compared to conventional designs.

In one example, an integrated circuit (IC) device is disclosed that include a first wafer coupled to a second by a first hybrid bond interface layer. The first wafer has a plurality of IC dies formed thereon that are separated by scribe lanes. The first wafer has an active side having a first front side bond pad and a back side having a first back side bond pad. The second wafer has a plurality of IC dies formed thereon that are separated by scribe lanes. The second wafer has an active side having a second front side bond pad, and a back side having a second back side bond pad. A first test key is formed in one of the scribe lanes of the first wafer. The first hybrid bond interface layer has a first U-turn connection that couples the first back side bond pad to the first test key.

In another example, an integrated circuit (IC) device is disclosed that include a first wafer coupled to a second wafer by a first hybrid bond interface layer, and a third wafer coupled to the second wafer by a second hybrid bond interface layer. The first wafer has an active side having a first front side bond pad and a back side having a first back side bond pad. The second wafer has a plurality of IC dies formed thereon that are separated by scribe lanes. The second wafer has an active side having a second front side bond pad, and a back side having a second back side bond pad. A first test key is formed in one of the scribe lanes of the first wafer. The third wafer has a plurality of IC dies formed thereon that are separated by scribe lanes. The third wafer has an active side having a third front side bond pad, and a back side having a third back side bond pad. A first test key is formed in one of the scribe lanes of the first wafer. A second test key is formed in one of the scribe lanes of the second wafer. A third test key is formed in one of the scribe lanes of the third wafer. The first hybrid bond interface layer includes a first U-turn connection that couples the first back side bond pad of the first wafer to the first test key. The second hybrid bond interface layer includes a second U-turn connection that couples the second back side bond pad of the second wafer to the second test key. The third hybrid bond interface layer includes a third U-turn connection that couples the third back side bond pad of the third wafer to the third test key.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

An IC device that includes a hybrid bond layer disposed between adjacent wafers of a wafer stack is disclosed herein. Routing within the hybrid bond layer enables metal connections, e.g., one or more test pads, to differentiate between wafers of a multi-wafer stack. The hybrid bond layer is formed on the contact pads for a given wafer of the wafer stack, thus allowing for greater flexibility for communication between IC dies and other structures, such as test keys, of the wafers of the wafer stack. Thus, two or more of the IC dies within the wafer stack (later diced to form IC die stacks) may be identical in construction and leverage the hybrid bond layer to enable testing of each tier of the wafer stack from exposed pads of the last (e.g., an outermost) wafer of the wafer stack. Advantageously, utilizing the hybrid bond layer with identical wafers (with identical IC dies) saves significant development cost and design time by reducing the number of masks required to fabricate a stacked IC device, among other benefits.

Figure 1:
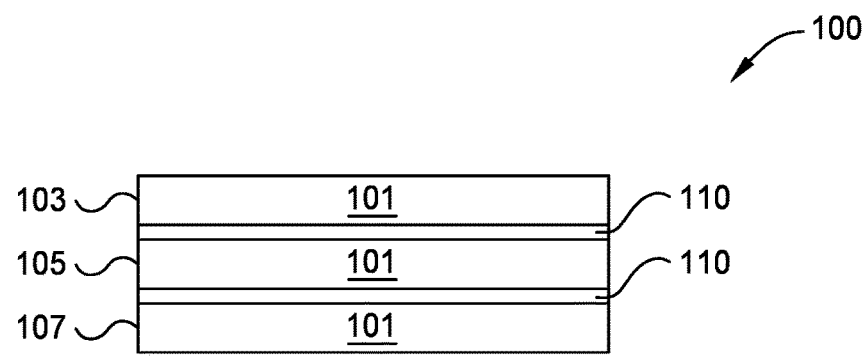
FIG. 1 is a schematic sectional view of a semiconductor wafer stack having a hybrid bond layer disposed between each of the semiconductor wafers.

FIG. 1 is a schematic sectional view of a semiconductor wafer stack 100 having a hybrid bond interface layer 110 disposed between each of the semiconductor wafers 101. As illustrated, the hybrid bond interface layer 110 is disposed between and in contact with a first wafer 103 and a second wafer 105. Another hybrid bond interface layer 110 is disposed between and in contact with a third wafer 107 and the second wafer 105. The second wafer 105 is vertically disposed between the first wafer 103 and the third wafer 107. The first wafer 103 is disposed on top of the second wafer 105.

Figure 2:
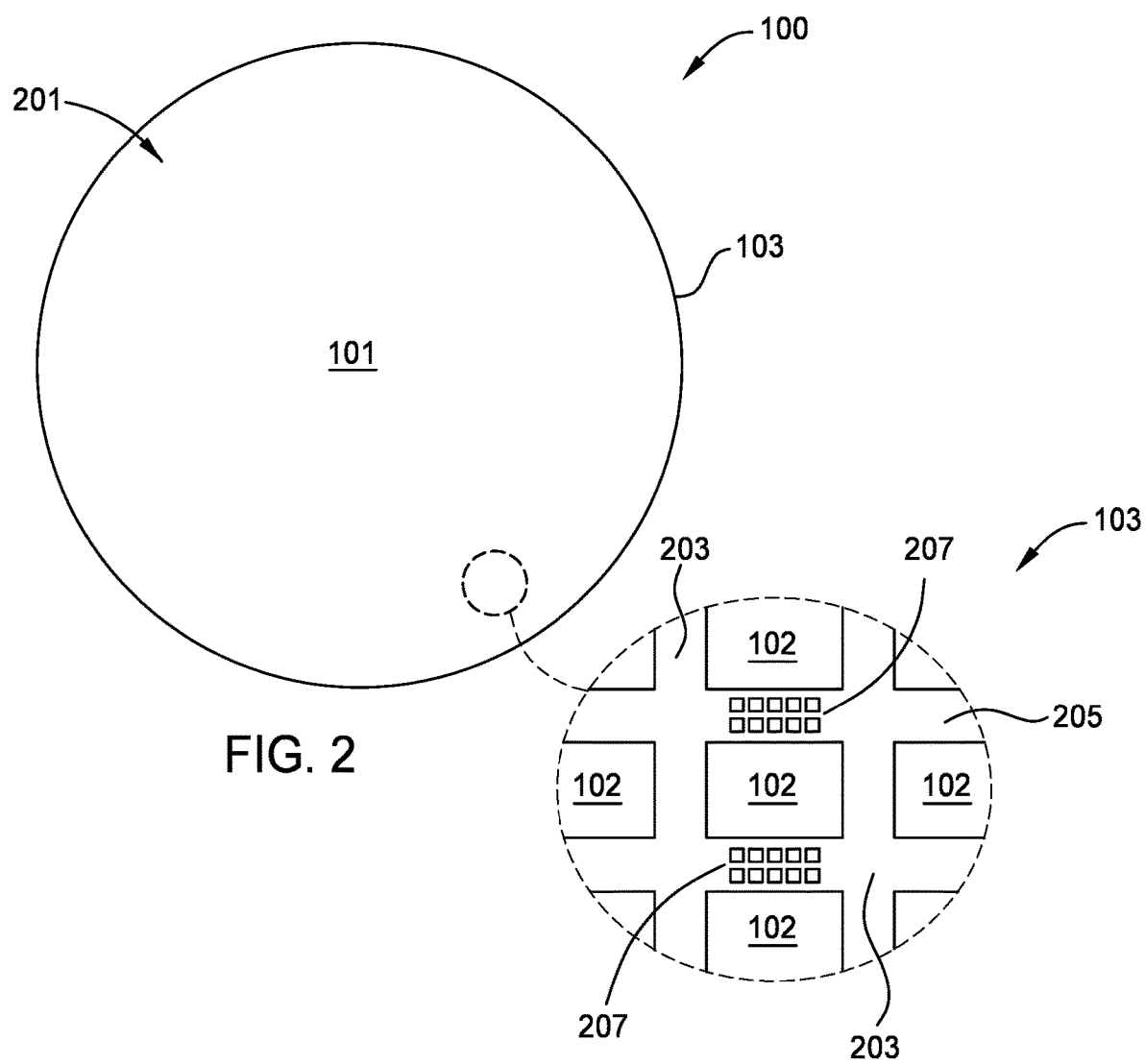
FIG. 2 is a top schematic view the semiconductor wafer stack shown in FIG. 1, illustrating an IC die and scribe lanes disposed in a top surface of a first wafer of the semiconductor wafer stack.

FIG. 2 is a top schematic view of semiconductor wafer stack 100, showing a plurality of IC dies 102 formed on the first wafer 103 of the wafer stack 100. As the IC dies 102 have yet to be separated, scribe lanes 203, 205 are shown disposed in a top surface 201 of the first wafer 103 of the semiconductor wafer stack 100 between the IC dies 102. The IC dies 102 and scribe lanes 203, 205 are identical for each of the semiconductor wafers 101. The grid-like pattern is formed by vertical scribe lanes 203 that are disposed orthogonally to horizontal scribe lanes 205, the scribe lanes 203, 205 being disposed between adjacent IC dies 102. As conventionally known, a dicing apparatus (not shown), such as a saw, traverses down the scribe lanes 203, 205 to separate the plurality of IC dies 102 present on the wafers 101 into individual IC dies 102. Test pads 207 are disposed on the first wafer 103 and are shown located in the horizontal scribe lanes 205. However, it is understood that test pads 207 can be alternatively or additionally disposed in the vertical scribe lanes 203 without departing from the subject matter of the disclosure.

Figure 2A:
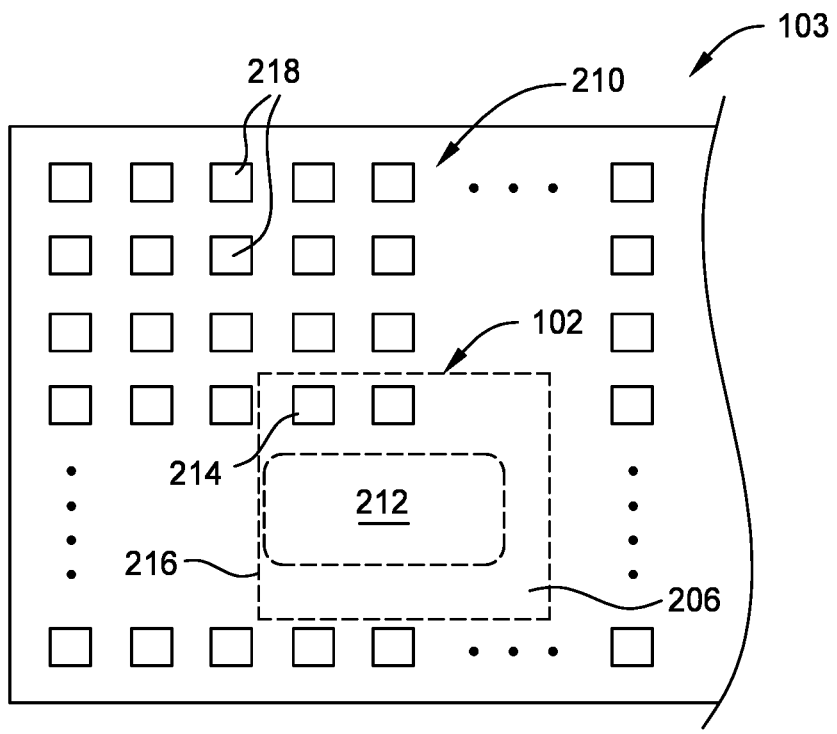
FIG. 2A is a schematic top view of a portion of the wafer stack illustrating an exemplary integrated circuit (IC) die having a plurality of bond pads.

FIG. 2A is a schematic top view of a portion of one of the wafers 101 that includes one of the integrated circuit (IC) dies 102 and test pads 207 disposed in the adjacent scribe line 205. The IC die 102 utilized in the IC device may be configured as, but are not limited to, programmable logic devices, such as field programmable gate arrays (FPGA), application-specific integrated circuit (ASIC), memory devices, such as high band-width memory (HBM), optical devices, processors, or other IC memory or logic structures. One or more of the IC dies 102, may optionally include optical devices such as photo-detectors, lasers, optical sources, and the like.

A plurality of active side active pads (ASAPs) 210 are disposed on at a top side 206 of the wafer 103. The ASAPs 210 include active side contact pads (ASCPs) 214 and active side pass-through pads (ASPTPs) 218. Although only an exemplary thirty (30) front side ASAPs 210 are shown in FIG. 2A, in excess of 400 ASAPs 210 may be exposed on each IC die 102. The IC die 102 has a die body 216 that includes functional circuitry 212. The functional circuitry 212 is schematically shown in phantom in FIG. 2A, for illustrative purposes.

ASCPs 214 are utilized to connect the functional circuitry 212 of the IC die 102 to power, ground, and/or data signals. ASPTPs 218 are disposed in the scribe lanes, such as the scribe lane 205 shown in FIGS. 2 and 2B, and are generally utilized as the test pads 207. The ASPTPs 218 enable power, ground, test, and/or data signals to bypass the given IC die 102, and electrically couple to an adjacent wafer 101, i.e., a second wafer 105, bypassing functional circuitry 212 of the IC die 102 residing in the first wafer 103. The ASPTPs 218 of one wafer 101 may be utilized to couple to a test key 320 of the same wafer 101, or to a test key residing in another wafer 101 as further described below.

Figure 2B:
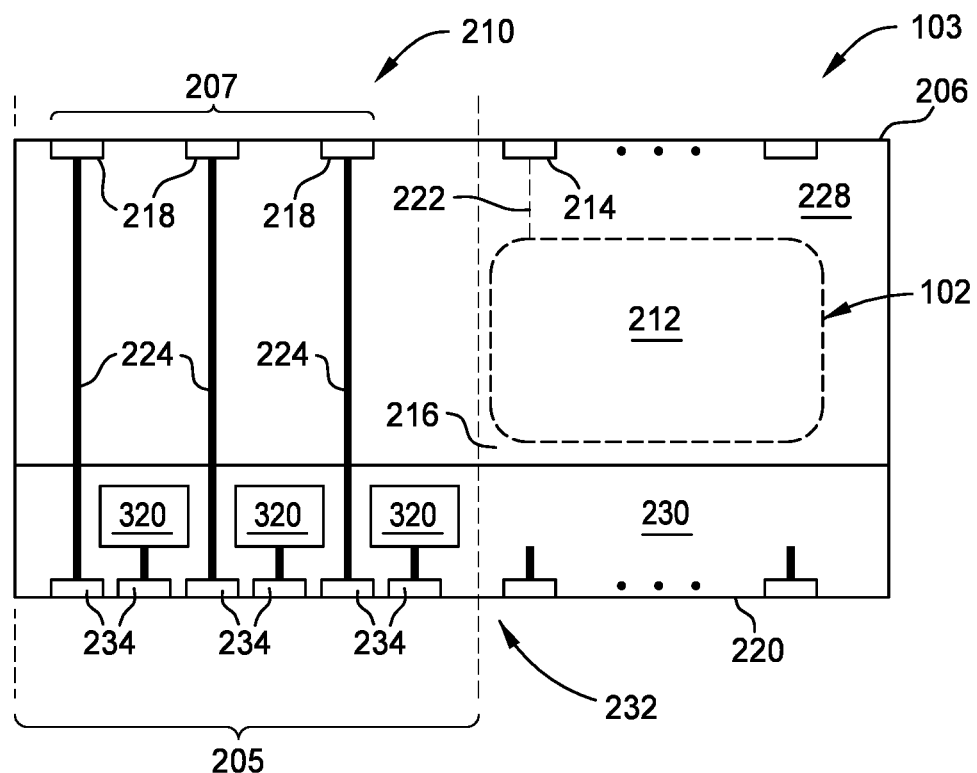
FIG. 2B is a schematic sectional side view of the IC die of FIG. 2A.

FIG. 2B is a schematic sectional side view of a portion of the first wafer 103 that includes the IC die 102 and adjacent scribe lane 205 corresponding to the top view of the wafer portion shown in FIG. 2A. The IC die 102 includes the top side 206 and a back side 220, which also are the top and back sides of the wafer 103. Back side contact pads (BSCPs) 232, which include back side pass-through pads (BSPTPs) 234, are disposed on the back side 220 of the die body 216. Pass-through routing 224 electrically couples each one of the ASPTPs 218 to a corresponding one of the BSPTPs 234. Each of the pass-through routing 224 has a first end and a second end, as illustrated in FIGS. 2B-4. One end of each of the pass-through routings 224 (e.g., the first end) is coupled to the BSPTPs 234 exposed on the back side 220 of the die body 216. The other end of the pass-through routings 224 (e.g., the second end) is coupled to a respective one of the ASPTPs 218 formed on the top side 206 of the die body 216.

Test keys 320 are disposed in the scribe lanes adjacent the IC die 102 adjacent corresponding BSCPs 232, as illustrated. The test keys 320 are selected to test different properties of the wafer, such as threshold voltage, saturation current, gate oxide thickness, or leakage current. The test key 320 may be an auxiliary conductive structure, an electrically activated structure (such as a process control monitor pad (PCM), or a non-electrically activated structure (such as a frame cell).

The die body 216 is later diced from the wafer 101 and includes active layers 228 formed on a substrate 230. The active layers 228 are formed on the substrate 230 and terminate at the top side 206 of the die body 216. The substrate 230 is disposed on a side of the active layers 228 that faces away from the top side 206. The functional circuitry 212 of the IC die 102 is formed in the active layers 228.

The active layers 228 includes metal and dielectric layers formed in the front end of the line (FEOL) and back end of the line (BEOL) regions of the die body 216. The functional circuitry 212 disposed in the active layers 228 has an arrangement of circuit elements, and functional routing 222. ASCPs 214 are coupled to the functional circuitry 212 via the functional routing 222. The circuit elements may include, but are not limited to, any one or more of transistors, diodes, resistors, capacitors, inductors, and memory cells, among others. The circuit elements are interconnected with each other and to the ASCPs 214 disposed on the top side 206 of the die body 216 by the functional routing 222.

Figure 3:
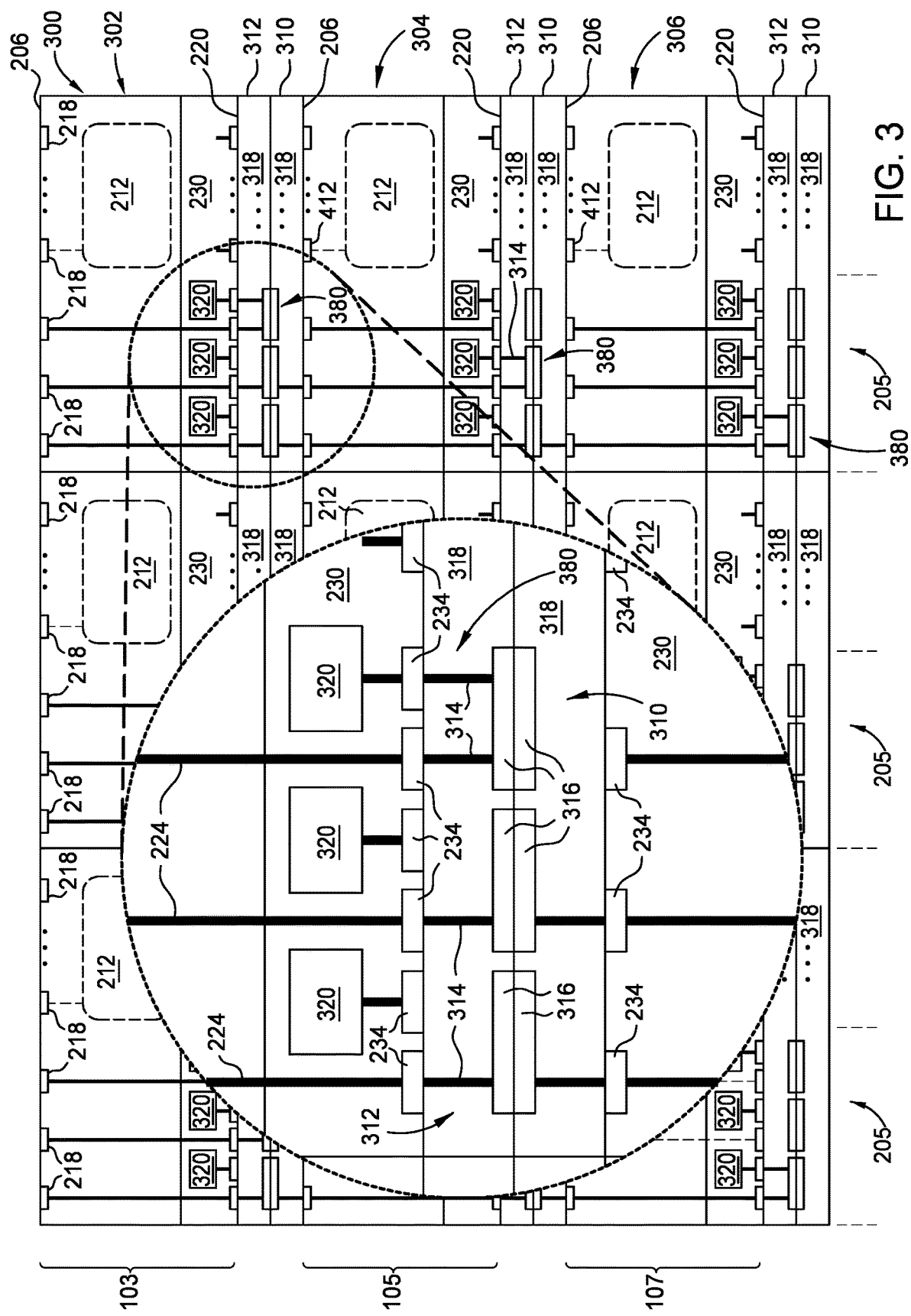
FIG. 3 is a schematic sectional view of a portion of the wafer stack having a plurality of IC dies.

FIG. 3 is a schematic partial sectional view of the wafer stack 100. IC dies 102 that are aligned within the wafer stack 100 form an IC die stack 300. The IC dies 102 in FIG. 3 are labelled as a first IC die 302, a second IC die 304, and a third IC die 306. Each IC die 302, 304, 306 has the same configuration as the IC die 102 shown in FIGS. 2A-2B. Stated differently, each IC die 302, 304, 306 is formed using the same mask sets, making the IC dies identical in construction. In one example, the IC dies 302, 304, 306 have identical locational layout of front and back side bond pads. In another example, the IC dies 302, 304, 306 are coupled front-side to back side. For example, the top side 206 of the third IC die 306 is coupled to the back side 220 of the second IC die 304. The top side 206 of the second IC die 304 is coupled to the back side 220 of the first IC die 302. In one example, the IC dies 302, 304, 306 of each of the first, second and third wafers 103, 105, and 107 are stacked in alignment and have identical circuitry and pad locations, such as functional circuitry 212, ASCPs 214 and BSCPs 232, and the like. However, the IC die stack 300 is not limited to this configuration.

The hybrid bond interface layer 110 is disposed between each adjacent IC die of the IC die stack 300. The hybrid bond interface layer 110 includes a first hybrid bond layer 310 and a second hybrid bond layer 312. Each of the first hybrid bond layer 310 and the second hybrid bond layer 312 has one or more hybrid bond contacts (HBCs) 314 (i.e., hybrid bond contact layer) and one or more hybrid bond layers (HBLs) 316. The HBC 314 and the HBL 316 are disposed within one or more layers of a dielectric material 318. Each of the HBC 314 has a first end and a second end, as shown. The HBC 314 is electrically and physically coupled to the HBL 316. The hybrid bond interface layer 110 is physically coupled to an adjacent IC die of the IC die stack 300. For example, the hybrid bond interface layer 110 is electrically and physically coupled to the back side 220 of the first IC die 302 and the back side of the first wafer 103.

The BSCPs 232 of the first IC die 302 are coupled to ASAPs 210 of the second IC die 304 through the hybrid bond interface layer 110. As such, the hybrid bond interface layer 110 couples the ASAPs 210 of the third IC die 306 to ASPTPs 218 of the second IC die 304. More specifically, the HBC 314 electrically couples the BSPTPs 234 to the HBL 316. The HBL 316 and the HBC 314 are coupled to ASAPs 210, including ASPTPs 218.

Each IC die 302, 304, 306 has functional routing 222 coupling ASCPs 214 to functional circuitry 212 of the given IC die 302, 304, 306. Each IC die 302, 304, 306 also includes pass-through routings 224 that couple ASPTPs 218 to BSPTPs 234. Similarly, another hybrid bond interface layer 110 is disposed between the back side 220 of the second IC die 304 and the top side 206 of the third IC die 306, i.e., between the first and second wafers 103, 105. Specifically, the hybrid bond interface layer 110 is in physical contact with the back side 220 of the second IC die 304 and the back side of the second wafer 105. The top side 206 of the third IC die 306 is coupled to the hybrid bond interface layer 110. In this manner, the second IC die 304 is electrically coupled to the third IC die 306. Alternatively in some embodiments, one or more of the IC dies 102 can be flipped, for example, such that the top side 206 of the first IC die 302 is disposed against the top side 206 of the second IC die 304.

The hybrid bond interface layer 110 is configured to allow connection to the functional circuitry 212 of each of the interior dies 304, 306 of the IC die stack 300 from the ASPTPs 218 exposed on the top side 206 of the last die 302 of the IC die stack 300. For example, one or more ASPTPs 218 exposed on the top side 206 of the last die 302 of the IC die stack 300 are respectfully connected to the ASCPs 214 of each of the interior dies 304, 306 of the IC die stack 300 via the hybrid bond interface layer 110 so that the functional circuitry 212 of each of the interior dies 304, 306 can be tested by contacting a test probe at the exposed ASPTPs 218 exposed on the top side 206 of the last die 302 of the IC die stack. In one example, given a pair of IC dies 102, opposing IC dies of the pair reside in opposite ones of the first wafer(s) 103 and second wafer(s) 105. As such, the pair of IC dies 102 have an identical locational layout of ASCPs 214 and back side bond pads BSBPs 232. In another example, at least two of the hybrid bond interface layers 110 disposed between different dies are configured differently, i.e., the HBC 314 and the HBL 316 within the first hybrid bond layer 310 and the second hybrid bond layer 312 of the HBC 314 and the HBL 316 of the hybrid bond interface layer 110 have different configurations to enable different electrical connections.

At least one of the test keys 320 disposed within each IC die 302, 304, 306 is coupled to an adjacent BSCP 232 using the hybrid bond interface layer 110. Circuitry formed by the connected second hybrid bond layer 312 and HBCs 314 within the hybrid bond interface layer 110, being configured differently between each wafer 101, allow all the test keys 320 formed in the different wafers 101 of the wafer stack 100 to be electrically accessed using the ASPTPs 218 exposed on the top surface of the first wafer 103.

To enable connection of a test key 320 to an adjacent BSPTP 234 of a given wafer 101, a "U-turn connection" 380 is formed in the hybrid bond interface layer 110 using the HBCs 314 and HBLs 316 to connect the pass-through routing 224 to the test keys 320. For example, pass-through routing 224 in the wafer 103 couples the ASPTP 218 to the BSPTP 234 of the first IC die 302. A first end of the HBC 314 is coupled to the BSPTP 234. The second end of the HBC 314 disposed in the second hybrid bond layer 312 is coupled to the HBL 316 of the second hybrid bond layer 312. The HBL 316 in the first hybrid bond layer 310 is disposed on top of and bonded in contact with the HBL 316 disposed in the second hybrid bond layer 312. The HBL 316 in the first hybrid bond layer 310 is not electrically connected by an HBC 314 of the first hybrid bond layer 310 to circuitry in the second wafer 105. Rather, a second HBC 314 within the second hybrid bond layer 312 has a first end that is coupled to the same HBL 316 in the first hybrid bond layer 310. A second end of the second HBC 314 is coupled to an BSPTP 234 of the first wafer 103 that is coupled to the adjacent test key 320 disposed in the first wafer 103, thereby completing the U-turn connection 380. Thus, the U-turn connection 380 has two HBCs 314 connected by one HBL 316 within a single hybrid bond layer that electrically couples the BSPTP 234 to an adjacent test key 320 within the same wafer 101. Thus, a first U-turn connection 380 is created in the hybrid bond interface layer 110 between the first wafer 103 and the second wafer 105.

Similarly, at least one of the ASPTPs 218 of the first wafer 103 is coupled to a test key 320 residing in the second wafer 105 using another U-turn connection 380. For example, the ASPTP 218 is coupled to one of the BSPTPs 234 of the second wafer 105 through the pass-through routing 224 in the first wafer 103, the hybrid bond layers 310, 312 between the wafers 103, 105, and the pass-through routing 224 in the second wafer 105. In the second hybrid bond layer 312 disposed between the second and third wafers 105, 107, another U-turn connection 380 is formed that couples the ASPTP 218 of the first wafer 103 to the test key 320 residing in the second wafer 105. This enables the test the test key 320 residing in the second wafer 105 to be tested after the wafer stack 100 has been formed from the ASPTPs 218 residing on the top side 206 of the first wafer 103.

Similarly, at least one of the ASPTPs 218 of the first wafer 103 is coupled to a test key 320 residing in the third wafer 107 using yet another U-turn connection 380. For example, the ASPTP 218 is coupled to one of the BSPTPs 234 of the second wafer 105 through the pass-through routing 224 in the first wafer 103, the hybrid bond layers 310, 312 between the first and second wafers 103, 105, the pass-through routing 224 in the second wafer 105, the hybrid bond layers 310, 312 between the second and third wafers 105, 107, and the pass-through routing 224 in the third wafer 107. In the second hybrid bond layer 312 disposed between the second and third wafers 105, 107, another U-turn connection 380 is formed that couples the ASPTP 218 of the first wafer 103 to the test key 320 residing in the third wafer 105. This enables the test the test key 320 residing in the third wafer 105 to be tested after the wafer stack 100 has been formed from the ASPTPs 218 residing on the top side 206 of the first wafer 103

In the example depicted in FIG. 3, the formation of geometrically different circuits within the hybrid bond interface layers 110 permits the IC dies 102 stacked on adjacent wafers within a wafer stack 100 to be configured identically. The stacked IC dies have identical locational layout of front side bond pads (i.e., ASCPs 214), functional circuitry 112, routing to and location of test keys 320, and back side bond pads (i.e., BSCPs). For example, at least two or more of the interior dies, e.g., IC dies 304 and 306 are identical. In another example, all of the IC dies 302, 304 and 306 are identical. In the identical dies, the functional circuitry 212 is identical, the physical locations of the test keys 320, ASAPs 210, BSCPs 232, and BSPTPs 234 are identical, and routing connections between the functional circuitry 212, pass-through routings 224, ASAPs 210, BSCPs 232, and BSPTPs 234 are identical. Thus, the die stacks 300 may be fabricated utilizing identical mask sets, saving development time, money and resources.

Figure 4:
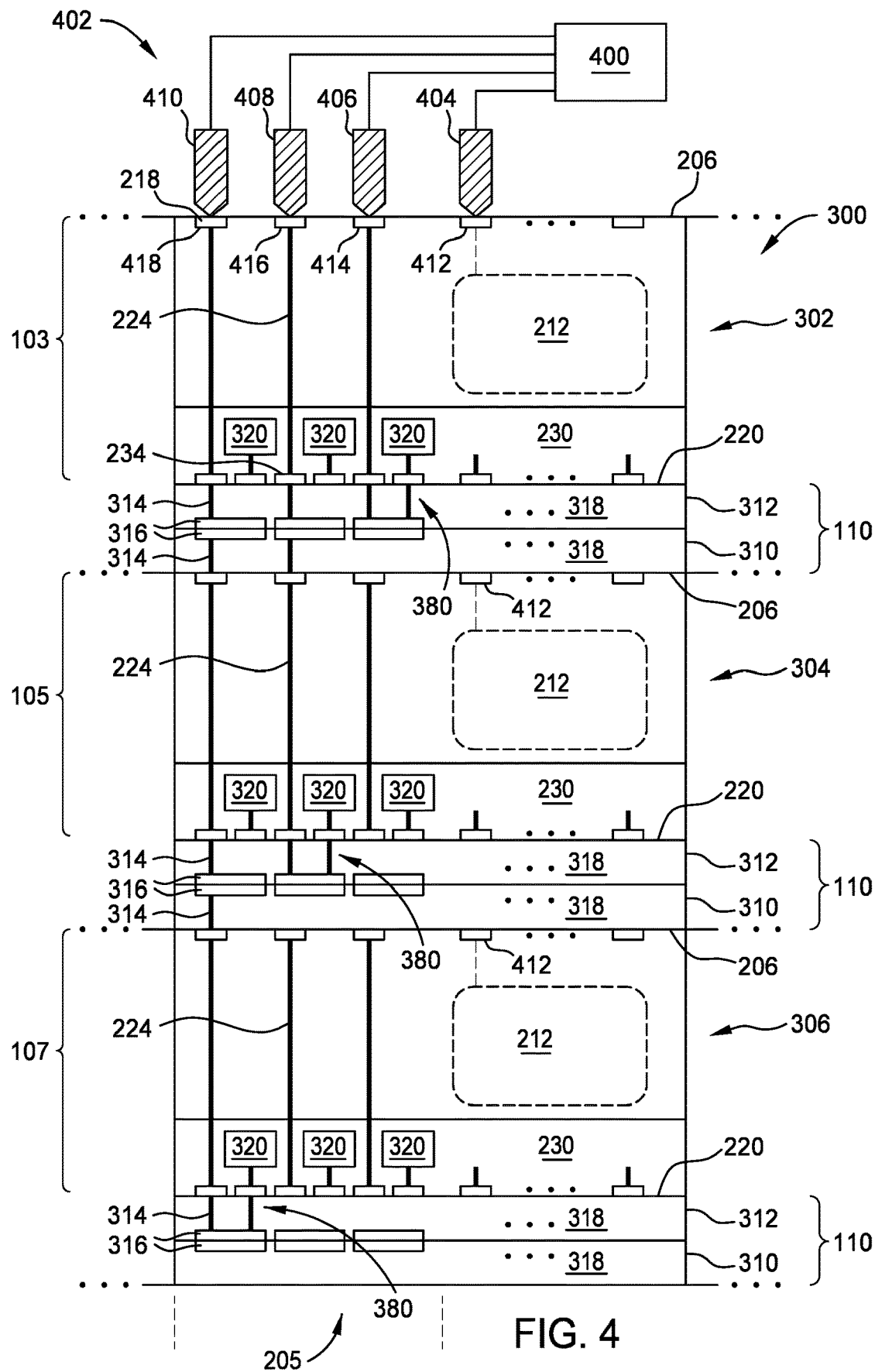
FIG. 4 shows a plurality of test pins in contact with test pads disposed on the wafer stack of FIG. 1.

The benefit of using identical U-turn connections between the wafers 100 of the wafer stack 100 is illustrated in FIG. 4. In FIG. 4, only a portion of the wafer stack 100 is illustrated, showing a single wafer stack 300.

In the example illustrated in FIG. 4 and discussed above, the hybrid bond interface layer 110 is configured to index the connection between the BSPTP 234 of the overlying die with the ASPTP 218 of the underlying die, with at least one of the BSPTPs 234 of the overlying die connecting to the test key 320 of the underlying die via the ASPTP 218 of the underlying die through the U-turn connection formed in the hybrid bond interface layer 110 connecting the over and underlying die/wafer. This configuration advantageously allows for the use of identical IC dies, while still enabling connections to the test keys of interior wafers of the wafer stack from the pads exposed on the last (i.e., top) wafer of the wafer stack, which reduces the number of mask sets needed to fabricate the IC dies, saving significant development time and money.

By utilizing the hybrid bond interface layer 110 disclosed herein, identical wafers 101 may be stacked and tested via the exposed pads on the outermost wafer of the stack without the additional time and costs for developing and qualifying additional mask sets for the other IC dies as found in conventional IC die stacks. For example, the connections to test keys in interior wafers of the wafer stack can be made through the hybrid bond interface layer 110 without the need to create a new mask set for the second IC die 304, or third IC die 306 that are formed on the second and third wafers 105, 107. Thus, the hybrid bond interface layer 110 ensures that at least the interiors IC dies 304, 306 of the IC die stack 300 can be identical, having the same functionality, performance and reliability as the first IC die 302 without the significant extra cost and time needed to developing additional mask sets. Accordingly, the hybrid bond interface layer 110 enables the ASPTPs 218 on the first wafer 103 to electrically couple to test keys 320 of the second wafer 105 and third wafer 107 through the pass-through routing 224 outside of the circuitry of the wafer, but rather through the hybrid bond interface layer 110 formed on the wafers after semiconductor fabrication processes have been completed.

In FIG. 4, a test system 400 having a plurality of probes 402 in contact with ASAPs 210 on the top side 206 of the top wafer 103. The plurality of probes 402 includes a first probe 404, second probe 406, a third probe 408, and a fourth probe 410. The first probe 404 can electrically couple to the functional circuitry 212 of the first IC die 302. The other probes 406, 408, 410 can electrically couple to the test keys 320 residing in each wafer 101 the wafer stack 100, as explained below.

By contacting a first test pad 412 of the ASAPs 210, the first probe 404 can communicate with and test the functional circuitry 212 of the first IC die 302 through the functional routing 222. The second test pad 414, third test pad 416, and fourth test pad 418 of the ASPTPs 218 are exposed on the top side 206 of the first wafer 103. The test pads 412, 414, 416, 418 enable the plurality of probes 402 to connect with the test keys 320 disposed on each of the wafers 103, 105, 107 utilizing the U-turn connections 380 formed between the adjacent wafers 101.

The second test pad 414 disposed on the first wafer 103 is electrically coupled to the test key 320 of the first wafer 103 via the U-turn connection 380 formed in the hybrid bond interface layer 110 disposed between and connecting the first and second wafers 103, 105. The third test pad 416 disposed on the first wafer 103 is electrically coupled to the test key 320 of the second wafer 105 via the U-turn connection 380 formed in the hybrid bond interface layer 110 disposed between and connecting the second and third wafers 105, 107. The fourth test pad 418 disposed on the first wafer 103 is electrically coupled to the test key 320 of the third wafer 107 via the U-turn connection 380 formed in the hybrid bond interface layer 110 disposed on side of the third wafer 107 opposite the second layer 105. Additional test pads (not shown) can be electrically coupled to the test keys of additional wafer should the wafer stack be more than the three wafers shown in the stack depicted in FIGS. 1, 3 and 4.

Disclosed herein, is wafer stack having a hybrid bond layer between adjacent wafers of the wafer stack, which can be later dices into die stacks. Advantageously, the U-turn connections within the hybrid bond layer enables the IC dies stacked across adjacent wafers to be identical, which reduces the time and cost required for fabrication of the IC die stack. While the foregoing is directed to embodiments of the present invention, other and further embodiments of the invention may be devised without departing from the basic scope thereof, and the scope thereof is determined by the claims that follow.

What is claimed is:

1. An integrated circuit (IC) device comprising:
   a first wafer having a plurality of IC dies formed thereon separated by scribe lanes, the first wafer having a first front side bond pad disposed on an active side and coupled with a first back side bond pad disposed on a back side of the first wafer, and a second front side bond pad disposed on the active side and coupled to a second back side bond pad disposed on the back side of the first wafer;
   a second wafer having a plurality of IC dies formed thereon separated by scribe lanes, the second wafer having a first front side bond pad disposed on an active side and coupled with a first backside bond pad disposed on a back side of the second wafer, and a second front side bond pad disposed on the active side and coupled to a second back side bond pad disposed on the back side of the second wafer;
a first test key formed in one of the scribe lanes of the first wafer;
a first hybrid bond interface layer coupling the first wafer to the second wafer, the first hybrid bond interface layer having a first U-turn connection that couples the first back side bond pad to the first test key;
a second test key disposed in one of the scribe lanes of the second wafer; and
a second hybrid bond interface layer formed on the second wafer, the second hybrid bond interface layer having a second U-turn connection that couples the second back side bond pad of the second wafer to the second test key;
wherein the second back side bond pad of the first wafer is aligned with and connected to the second front side bond pad of the second wafer through the first hybrid bond interface layer, and
wherein the second back side bond pad of the second wafer is connected to a back side test key bond pad of the second test key disposed in the second wafer through the second hybrid bond interface layer.

2. The integrated circuit device of claim 1, wherein the first U-turn connection further comprises:
a first hybrid contact layer coupled to the first back side bond pad;
a second hybrid contact layer coupled to the first test key; and
a first hybrid bond layer coupled to the first hybrid contact layer and the second hybrid contact layer.

3. The integrated circuit device of claim 1, wherein the first wafer further comprises:
a third front side bond pad coupled by pass-through routing to a third back side bond pad, and
wherein the first hybrid bond interface layer couples the third back side bond pad of the first wafer to a third front side bond pad of the second wafer.

4. The integrated circuit device of claim 1, wherein the first wafer further comprises:
a second test key not connected to a front side bond pad of the first wafer and aligned with the second test key of the second wafer.

5. The integrated circuit device of claim 1, further comprising:
a third wafer having a plurality of IC dies formed thereon separated by scribe lanes, the third wafer having a first front side bond pad disposed on an active side and coupled with a first backside bond pad disposed on a back side of the second wafer, a second front side bond pad disposed on the active side and coupled to a second back side bond pad disposed on the back side of the second wafer, a third front side bond pad disposed on the active side and coupled to a third back side bond pad disposed on the back side of the second wafer, the third wafer coupled to the second wafer by the second hybrid bond interface layer, and the first wafer having a third front side bond pad disposed on the active side of the first water.

6. The integrated circuit device of claim 5, further comprising:
a third test key disposed in one of the scribe lanes of the third wafer; and
a third hybrid bond interface layer formed on the third wafer, the third hybrid bond interface layer having a third U-turn connection that couples the third back side bond pad of the third wafer to the third test key.

7. The integrated circuit device of claim 6, wherein the third front side bond pad of the first wafer is communicatively coupled to the third test key through the first hybrid bond interface layer, the second hybrid bond interface layer and the third hybrid bond interface layer.

8. The integrated circuit device of claim 7, wherein the IC dies of each of the first, second and third wafers are stacked in alignment and have identical circuitry and pad location.

9. The integrated circuit device of claim 1, wherein a first IC die of the plurality of IC dies disposed on the first wafer and a second IC die of the plurality of IC dies disposed on the second wafer have identical functional circuitry.

10. The integrated circuit device of claim 9, wherein the first IC die and the second IC die are formed from a same mask set.

11. The integrated circuit device of claim 1, wherein for at least a pair of IC dies, opposite IC dies of the pair reside in opposite ones of the first and second wafers, the pair of IC dies having an identical locational layout of front and back side bond pads.

12. An integrated circuit (IC) device comprising:
a first wafer having a plurality of IC dies formed thereon separated by scribe lanes, the first wafer having an active side having a first front side bond pad and a back side having a first back side bond pad, the plurality of IC dies formed on the first wafer including a first IC die;
a second wafer having a plurality of IC dies formed thereon separated by scribe lanes, the second wafer having an active side having a second front side bond pad, and a back side having a second back side bond pad, the plurality of IC dies formed on the second wafer including a second IC die;
a third wafer having a plurality of IC dies formed thereon separated by scribe lanes, the third wafer having an active side having a third front side bond pad, and a back side having a third back side bond pad, the plurality of IC dies formed on the third wafer including a third IC die that is stacked in alignment with the first and second IC dies;
a first test key, a second test key, and a third test key formed in one of the scribe lanes of the first wafer;
a first hybrid bond interface layer coupling the first wafer to the second wafer, the first hybrid bond interface layer having a first U-turn connection that couples the first back side bond pad of the first wafer to the first test key;
a first test key, a second test key, and a third test key formed in one of the scribe lanes of the second wafer, the test keys of the first wafer vertically aligned with the test keys of the second wafer;
a second hybrid bond interface layer coupling the second wafer to the third wafer, the second hybrid bond interface layer having a second U-turn connection that couples the second back side bond pad of the second wafer to the second test key of the second wafer, the second U-turn connection not aligned with the first U-turn connection disposed in the first hybrid bond interface layer; and
a first test key, a second test key, and a third test key formed in one of the scribe lanes of the third wafer, the test keys of the third wafer vertically aligned with the test keys of the second wafer; and
a third hybrid bond interface layer formed on the third wafer, the third hybrid bond interface layer having a third U-turn connection that couples the third back side bond pad of the third wafer to the third test key of the third wafer, wherein a different one of the test keys of each wafer is coupled to a front side bond pad of the first wafer.

13. The integrated circuit device of claim 12, wherein the second and third IC dies are identical.

14. The integrated circuit device of claim 12, wherein the second and third IC dies are formed from one mask set.

15. The integrated circuit device of claim 12, wherein each of the U-turn connections further comprises:
    a first hybrid contact layer coupled to a front side bond pad of the first wafer;
    a second hybrid contact layer coupled to one of the first, second or third test keys; and
    a hybrid bond layer coupled to the first hybrid contact layer and the second hybrid contact layer.

16. The integrated circuit device of claim 12, wherein the U-turn connections are not vertically aligned.

17. The integrated circuit device of claim 12, wherein the second U-turn connection is electrically coupled to a fourth front side bond pad of the first wafer through the first hybrid bond interface layer.

18. The integrated circuit device of claim 17, wherein the third U-turn connection is electrically coupled to a fifth front side bond pad of the first wafer through the first hybrid bond interface layer and the second hybrid bond interface layer.

19. The integrated circuit device of claim 18, wherein:
    (a) the first U-turn connection further comprises:
        a first hybrid contact layer coupled to the first front side bond pad of the first wafer;
        a second hybrid contact layer coupled to the first test key; and
        a hybrid bond layer coupled to the first hybrid contact layer and the second hybrid contact layer;
    (b) the second U-turn connection further comprises:
        a first hybrid contact layer coupled to the second front side bond pad of the first wafer;
        a second hybrid contact layer coupled to the second test key; and
        a hybrid bond layer coupled to the first hybrid contact layer and the second hybrid contact layer; and
    (c) wherein the third U-turn connection further comprises:
        a first hybrid contact layer coupled to the third front side bond pad of the first wafer;
        a second hybrid contact layer coupled to the third test key; and
        a hybrid bond layer coupled to the first hybrid contact layer and the second hybrid contact layer.

* * * * *